United States Patent [19]

Konicek

[11] 4,162,932

[45] Jul. 31, 1979

[54] METHOD FOR REMOVING RESIN SMEAR IN THROUGH HOLES OF PRINTED CIRCUIT BOARDS

[75] Inventor: Jiri Konicek, Florence, Mass.

[73] Assignee: Perstorp, AB, Perstorp, Sweden

[21] Appl. No.: 845,584

[22] Filed: Oct. 26, 1977

[51] Int. Cl.² ............... C03C 15/00; C03C 25/06
[52] U.S. Cl. .................... 156/630; 156/151; 156/632; 156/645; 156/665; 156/902
[58] Field of Search ............... 427/97; 29/625; 156/150, 151, 630, 632, 633, 634, 644, 645, 656, 659, 665, 666, 901, 902; 134/24, 34, 38, 22 R; 204/23, 27, 33

[56] References Cited

U.S. PATENT DOCUMENTS

| | | | |
|---|---|---|---|
| 3,276,106 | 10/1966 | Bester et al. | 156/629 X |
| 3,568,296 | 3/1971 | Cutillo et al. | 29/625 X |

*Primary Examiner*—William A. Powell
*Attorney, Agent, or Firm*—Stevens, Davis, Miller & Mosher

[57] ABSTRACT

A method for the production of through holes in a laminate used for printed wiring and consisting of an insulating base of glass fiber reinforced thermosetting resin provided on at least one side with a thin continuous layer of copper or copper alloy, comprising laminating said layer of copper or copper alloy under heat and pressure to a final base-forming material consisting of at least one sheet of glass fiber reinforced thermosetting resin, subsequently drilling or punching holes in said laminate causing the formation of resin smear in said layer of copper or copper alloy and applying a water-jet stream to said resin smear to remove it from said laminate.

3 Claims, 5 Drawing Figures

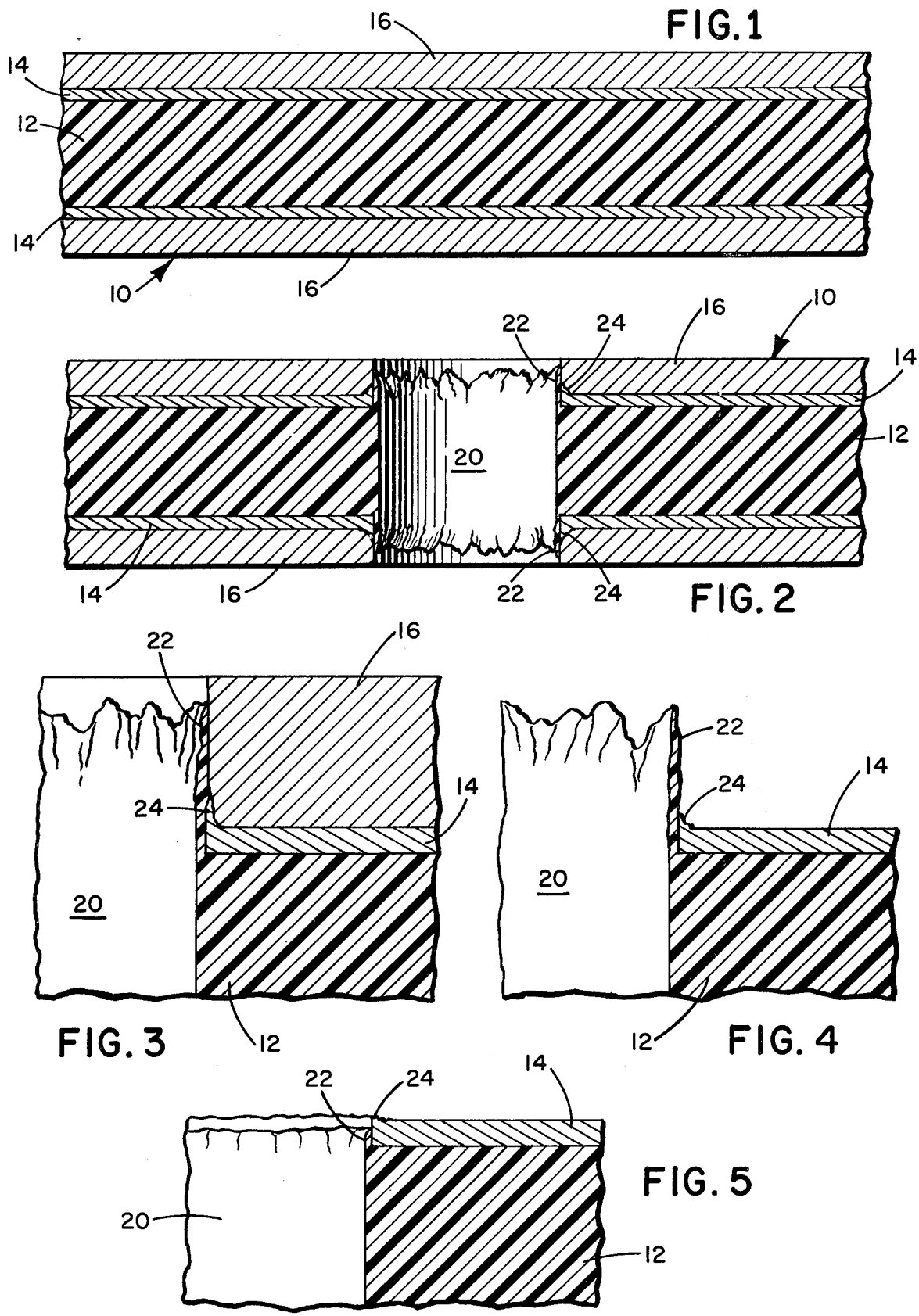

METHOD FOR REMOVING RESIN SMEAR IN THROUGH HOLES OF PRINTED CIRCUIT BOARDS

The present invention relates to a method for the production of through holes in a laminate comprising an insulating base clad with a thin metal layer on at least one side.

Printed wiring is used to a large extent in the electronics industry in the form of a printed wiring board. The board is at present usually produced with a copper-clad insulating sheet or laminate as starting material.

Comparatively simple kinds of printed wiring boards are manufactured by etching a laminate clad with copper on only one side. Then a copy of the desired wiring pattern is transferred to the copper layer before the etching for example by printing or by a photochemical process. The applied copy, the so called etch resist, constitutes a protection at the etching of superfluous copper. After the etching the etch resist is removed.

More technically advanced printed wiring boards are equipped with wiring patterns on both sides of the laminate and so called plated through holes for electrical connection between the two sides. These printed wiring boards are usually produced from laminates clad with copper on both sides. The process for the production of these boards includes machining of holes, plating with copper, and etching.

Printed wiring boards having wiring patterns in many planes, so called multilayer printed wiring boards are also produced to a large extent. Plated through holes are also used in this process.

Single-sided, double-sided and multilayer printed circuit boards comprise a large number of holes, drilled into patterns to accommodate the components and eventually also to serve as interconnections among layers.

Drilling of printed circuit boards is one of the more expensive operations in the manufacture of printed circuit boards. Drilling techniques have constantly improved and multi-spindle, high revolution (40,000 rpm and up) numerically controlled drilling machines are being used to perform the task but even with improved drilling techniques imperfections in the board occur.

The quality of drilling directly affects the quality of the hole and consequently both processability and also reliability of the PC board. High drilling speeds are required for the economical utilization of the drill and to reduce drill wear. However, these high speeds together with other factors occasionally cause holes with less than perfect quality to be manufactured.

The main imperfections consist of drill burrs from the metal, resin smear from the resin insulating base and a rough inside-hole surface. On boards where initial copper thickness exceeds 8 microns (typically 18 and 35 microns), the burrs can be removed by a suitable sanding operation. Drill smear is considered a nuisance in the manufacture of double-sided, three-hole plated PC boards, but the known methods for its removal are in general too costly. To date chemical or plasma etch-back of resin smear is used extensively on multilayer PC boards.

Laminates clad with ultra-thin copper foil are gaining increasing use in manufacturing through hole plate PC boards. One method employed in the manufacture of ultra-thin copper foil boards uses thicker aluminum foil as a carrier, finely attached to the thin foil itself. The sandwich Al-Cu foil is laminated with for example, glas-epoxi plastic to form a laminate.

In one method utilizing this laminate, holes are drilled in the usual manner, with the aluminum carrier still in place. When optimum drilling conditions are observed, holes of perfect quality with virtually no smear or burrs are created. However, under high volume production conditions, a certain number of burrs and drill smears may be created.

Removal of burrs on ultra-thin copper clad laminates with an etchable aluminum carrier can be effected following the method described in U.S. Pat. No. 4,023,998. Different chemical characteristics of copper and aluminum permit etching back a few microns of copper, before removal of aluminum by etching in another chemical solution. This procedure is superior to ordinary sanding of the panels because it can be done as a batch process rather than on an individual basis. Sanding is very difficult to accomplish on the ultra-thin foils.

Resin smear appears sometimes with burr formation when processing ultra-thin copper laminates. Resin smear after improper drilling covers partially or wholly the inside surface of the hole within the aluminum carrier. A convenient method for removing that resin smear from the drilled ultra-thin copper laminates has now been found.

By utilizing pressurized water in the form of a water-jet nozzle the resin smear can be satisfactorily removed.

The present invention will be described in more detail in the following examples and accompanying drawings in which:

FIG. 1 is an enlarged cross-sectional view of a double-sized circuit board prior to drilling holes for accommodating components;

FIG. 2 is an enlarged cross-sectional view of one hole of the board of FIG. 1 after drilling;

FIG. 3 is an enlarged cross-section of a portion of the hole of FIG. 2;

FIG. 4 is an enlarged cross-section of a portion of one hole after aluminum etching; and FIG. 5 is an enlarged cross-section of a portion of the hole of FIG. 4 after water treatment.

In FIG. 1 the circuit board 10 prior to drilling is composed of a glas-epoxi laminate base 12 to which has been applied a copper layer 14 on both sides thereof and to which copper layer a temporary aluminum protective base 16 has been applied.

For producing the copper coating or layer of a thickness of 35 $\mu$m or more it is common to use copper foils or sheets which are placed on a base-forming fiber material impregnated with partially cured or hardened plastic (so called prepreg). Then the composite material is molded at high pressure and increased temperature, whereby a final curing of the plastic is obtained which results in a conversion of the material into a fiber reinforced plastic sheet to which the copper foil is firmly joined. According to another usual method the copper foil is glued to a plastic film by means of heat and pressure. However, when the coating is for example 5 $\mu$m thick a temporary base of aluminum foil is plated with a layer of copper or a copper alloy and joined to the insulating final base in a way similar to the one described above. The temporary base, of course, is ultimately removed.

In FIGS. 2 and 3 the effect of drilling is seen. In the drilled hole 20, there exists resin smear 22 as well as a copper burr 24.

Even with sizable resin smear, the chemical deburring can still be effected because the smeared resin layer is porous to a degree and permits the deburring chemical to reach the copper burr surface.

The dissolution of the burrs is accomplished by an agent which can dissolve the constituents of the thin metal layer but does not attack the protective foil or layer. Alternatively an agent is used which can dissolve the constituents of the thin metal layer faster than the material of the protective foil or layer. In both cases the agent will rapidly dissolve the burrs in the thin metal layer. The remaining surface of the thin metal layer is effectively protected by the aluminum foil against undesirable dissolution. The dissolution can for example be carried out by etching or by anodical dissolution.

There are many suitable etching agents which can be used. Among these ammonium persulfate, 10 percent nitric acid, or 2 percent hydrogen peroxide together with sulphuric acid can be mentioned. The choice of etching agent is not critical on condition that the agent satisfies the above demand for ability to etch in a selective way. Anodical dissolution can for example be carried out by electrolysis in diluted sulphuric acid containing chloride ions.

The temporary aluminum base 16 is subsequently removed, for example by etching, stripping, tearing off or a combination thereof as shown in FIG. 4. If etching of aluminum from the board is undertaken it usually is performed in racks, where for example 10 or more boards are fixed.

After the aluminum has been removed and after chemical deburring has taken place the resin smear still exists and protrudes from the surface of the laminates as a ring of thin plastic, loosely attached to the surface of the board.

To successfully remove the resin smear as shown in FIG. 5 a stream of pressurized water in the form of water-jet nozzle, pressure shower or pulsating shower, is sprayed from a side in between the panels. Alternatively, if the size of the copper burr is within acceptable limits, the water blast desmearing procedure can be utilized without first deburring. Thus the water blast technique can be used with or without chemical deburring.

EXAMPLE 1

Nine boards 18"×24" were drilled with 1500 new drills, stacked 3 up of a diameter 0.042 inches at 40,000 rpm. The hole quality was very good and virtually no excessive burrs or resin smear was present. The boards processed well through the aluminum etching and electroless three-hole plating. They created no problems in the following silk screening and plating operation.

EXAMPLE 2

Nine boards 18"×24" were drilled with twice used drills, of a diameter 0.042 inches at 80,000 rpm, 1500 bits, stacked 3 up. The hole quality was not perfect. There were burrs as high as 7 microns and smear after etching the aluminum protruding up to 35 microns from the surface. The boards processed well through aluminum etching and electroless through hole plating. Problems developed in silk screening with overplated protrusions and later in pattern plating even more protruding bulges of copper developed. Of the resulting boards only five were of acceptable quality.

EXAMPLE 3

Nine boards 18"×24" were drilled and prepared as in Example 2. The hole quality was not satisfactory, burrs and resin smear were formed as in Example 2. The burrs, however, were not deemed to be of a sufficient degree to require removal. After aluminum etching, the rack with the boards was transferred into an empty tank and the boards were sprayed by rinse water under 65 psi pressure, using a "Water Pik" pulsating shower head for 2 minutes and moving the shower head so, that all surfaces within the rack had been sprayed.

The boards processed well through the electroless plating. In subsequent silk screening, the remaining small copper burrs constituted no problems. After pattern plating and finishing the manufacture of the board, all nine boards were satisfactory.

If however, it is deemed necessary to remove the burrs before etching the aluminum the drilled boards are dipped into 10% solution of ammonium persulfate for 5 minutes. The treatment removes virtually all burrs.

The invention is not limited to the embodiments shown as these can be modified in different ways within the scope of the invention.

What is claimed is:

1. In a method for the production of through holes in a laminate used for printed wiring and consisting of an insulating base of glass fiber reinforced thermosetting resin provided on at least one side with a thin continuous layer of copper or copper alloy, comprising laminating said layer of copper or copper alloy under heat and pressure to a final base-forming material consisting of at least one sheet of glass fiber reinforced thermosetting resin, and subsequently drilling or punching holes in said laminate causing the formation of resin smear in said layer of copper or copper alloy, the improvement consisting of applying a water-jet stream to said resin smear to remove it from said laminate.

2. In a method for the production of through holes in a laminate used for printed wiring and consisting of an insulating base of glass fiber reinforced thermosetting resin provided on at least one side with a thin continuous layer of copper or copper alloy, comprising electroplating said thin continuous layer of copper or copper alloy to a temporary base of a throwaway type comprising a foil of aluminum or an alloy thereof having a thickness of up to about 200μm, laminating said layer of copper or copper alloy on said temporary based under heat and pressure to a final base-forming material consisting of at least one sheet of glass fiber reinforced thermosetting resin, and subsequently drilling or punching holes in said laminate causing the formation of resin smear in said layer of copper or copper alloy, the improvement consisting of removing the foil of aluminum or aluminum alloy by etching, stripping, tearing off, or a combination thereof, leaving said thin electroplated layer of copper or copper alloy on the final base and applying a water-jet stream to said resin smear to remove it from said laminate.

3. In a method for the production of through holes in a laminate used for printed wiring and consisting of an insulating base of glass fiber reinforced thermosetting resin provided on at least one side with a thin continuous layer or copper alloy, comprising electroplating said thin continuous layer of copper or copper alloy to a temporary base of a throwaway type comprising a foil of aluminum or an alloy thereof having a thickness of up to about 200μm, laminating said layer of copper or copper alloy on said temporary base under heat and pressure to a final base-forming material consisting of at least one sheet of glass fiber reinforced thermosetting resin, and subsequently drilling or punching holes in said laminate causing the formation of burrs and resin smear in said layer of copper or copper alloy, the improvement consisting of dissolving said burrs, removing the alloy of aluminum or aluminum foil by etching, stripping, tearing off, or a combination thereof, leaving said thin electroplated layer of copper or copper alloy on the final base free of burrs and applying a water-jet stream to said resin smear to remove it from said laminate.

* * * * *

UNITED STATES PATENT AND TRADEMARK OFFICE
CERTIFICATE OF CORRECTION

PATENT NO. : 4,162,932
DATED : July 31, 1979
INVENTOR(S) : Jiri Konicek

It is certified that error appears in the above–identified patent and that said Letters Patent are hereby corrected as shown below:

Column 4, line 64, insert -- of copper -- between "layer" and "or".

Column 6, line 1, cancel "alloy" and insert -- foil ---; and cancel "foil" and insert -- alloy --.

Signed and Sealed this

Twenty-sixth Day of February 1980

[SEAL]

Attest:

Attesting Officer

SIDNEY A. DIAMOND

Commissioner of Patents and Trademarks